United States Patent
Neary et al.

[11] Patent Number: 5,874,329
[45] Date of Patent: Feb. 23, 1999

[54] METHOD FOR ARTIFICIALLY-INDUCING REVERSE SHORT-CHANNEL EFFECTS IN DEEP SUB-MICRON CMOS DEVICES

[75] Inventors: Paul Neary, Mountain View; Lindor E. Henrickson, San Jose, both of Calif.

[73] Assignee: LSI Logic Corporation, Milpitas, Calif.

[21] Appl. No.: 761,761

[22] Filed: Dec. 5, 1996

[51] Int. Cl.$^6$ .................... H01L 21/8238; H01L 21/336
[52] U.S. Cl. ........................... 438/203; 438/302
[58] Field of Search .................... 438/302, 305, 438/203

[56] References Cited

U.S. PATENT DOCUMENTS

| | | |
|---|---|---|
| 4,841,346 | 6/1989 | Noguchi . |
| 4,859,620 | 8/1989 | Wei et al. . |
| 4,901,129 | 2/1990 | Hynecek . |
| 5,217,910 | 6/1993 | Shimizu et al. ........................ 437/35 |
| 5,258,319 | 11/1993 | Inuishi et al. ........................ 437/35 |
| 5,372,957 | 12/1994 | Liang et al. ........................ 437/35 |
| 5,409,848 | 4/1995 | Han et al. ........................ 437/35 |
| 5,413,945 | 5/1995 | Chien et al. ........................ 437/35 |
| 5,500,379 | 3/1996 | Odake et al. ........................ 437/34 |
| 5,512,498 | 4/1996 | Okamoto ........................ 437/35 |
| 5,532,176 | 7/1996 | Katada et al. ........................ 437/34 |
| 5,686,324 | 11/1997 | Wang et al. ........................ 437/44 |
| 5,716,862 | 2/1998 | Ahmad et al. ........................ 437/41 |
| 5,753,556 | 5/1998 | Katada et al. ........................ 438/302 |

OTHER PUBLICATIONS

Wolf, "Silicon Processing for the VLSI Era, vol. 2: Process Integration", Lattice Press, Sunset Beach, CA, pp. 309–311 (1990).

Wolf, "Silicon Processing for the VLSI Era, vol. 3: The Submicron Mosfet", Lattice Press, Sunset Beach, CA, pp. 232–241 and 308–313. (1995).

*Primary Examiner*—John F. Niebling
*Assistant Examiner*—Michael L Lebentritt

[57] ABSTRACT

The present invention comprises a method for controlling a threshold voltage through a semiconductor substrate of a first conductivity type (the type being an n- or p- type in a MOSFET) without the need for a blanket implant for either long or short channel devices. A gate structure having opposed lateral edges is formed adjacent a surface of the semiconductor substrate and over a channel region of the substrate. The substrate is rotated around a rotation axis normal to the surface of the substrate to a first rotation position. Ions of a first conductivity type are then implanted into the channel region, using the gate structure as a mask, at an oblique angle relative to the surface normal of the substrate. The substrate is then rotated to a second rotation position approximately 180 degrees from the first rotation position. Ions of the first conductivity type are then implanted into the channel region, using the gate structure as a mask, at the oblique angle relative to the surface of the substrate.

13 Claims, 5 Drawing Sheets

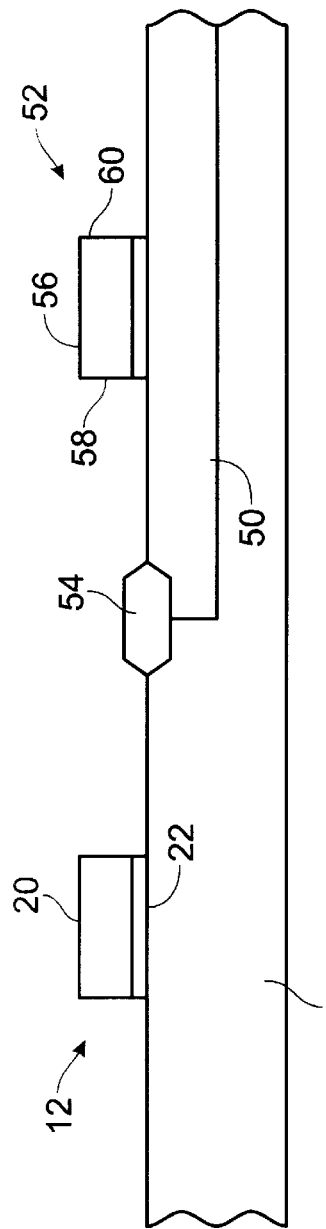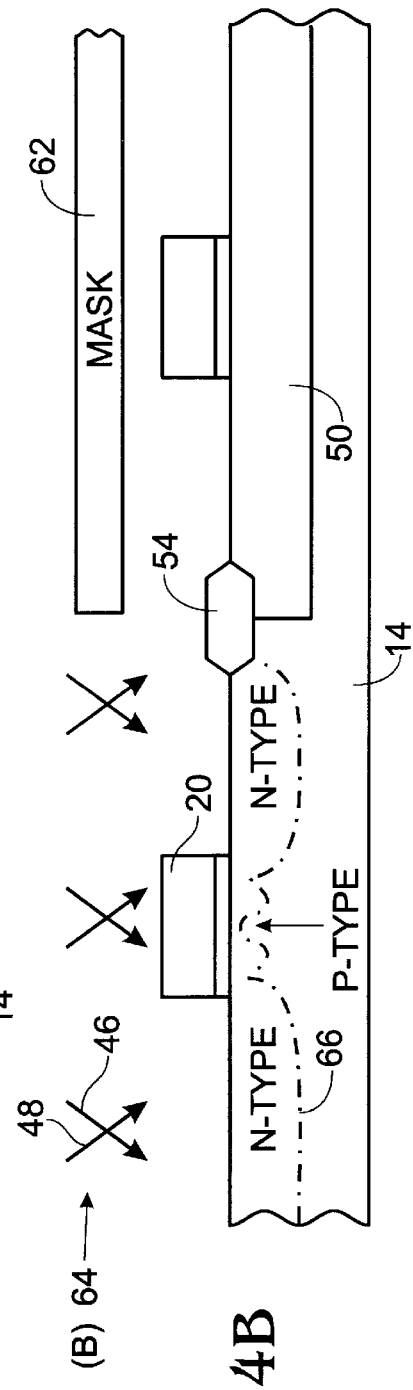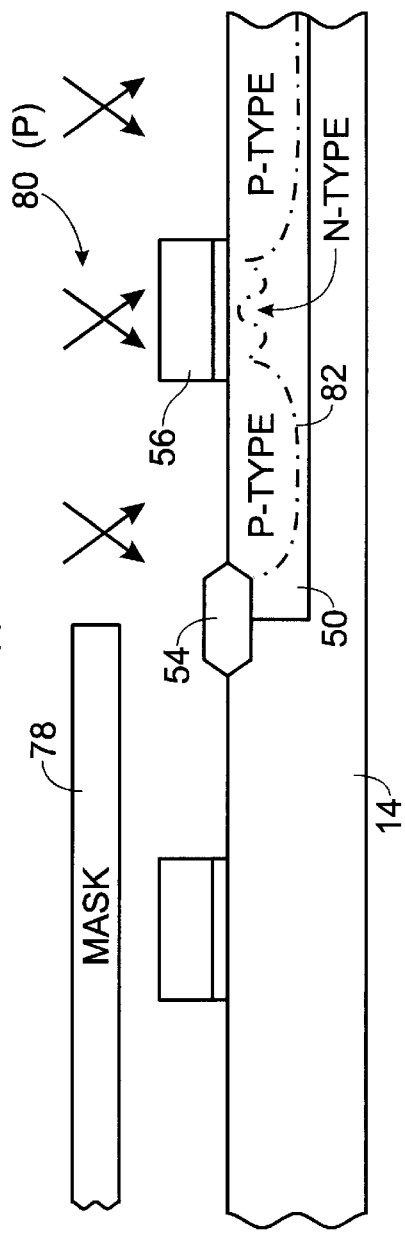

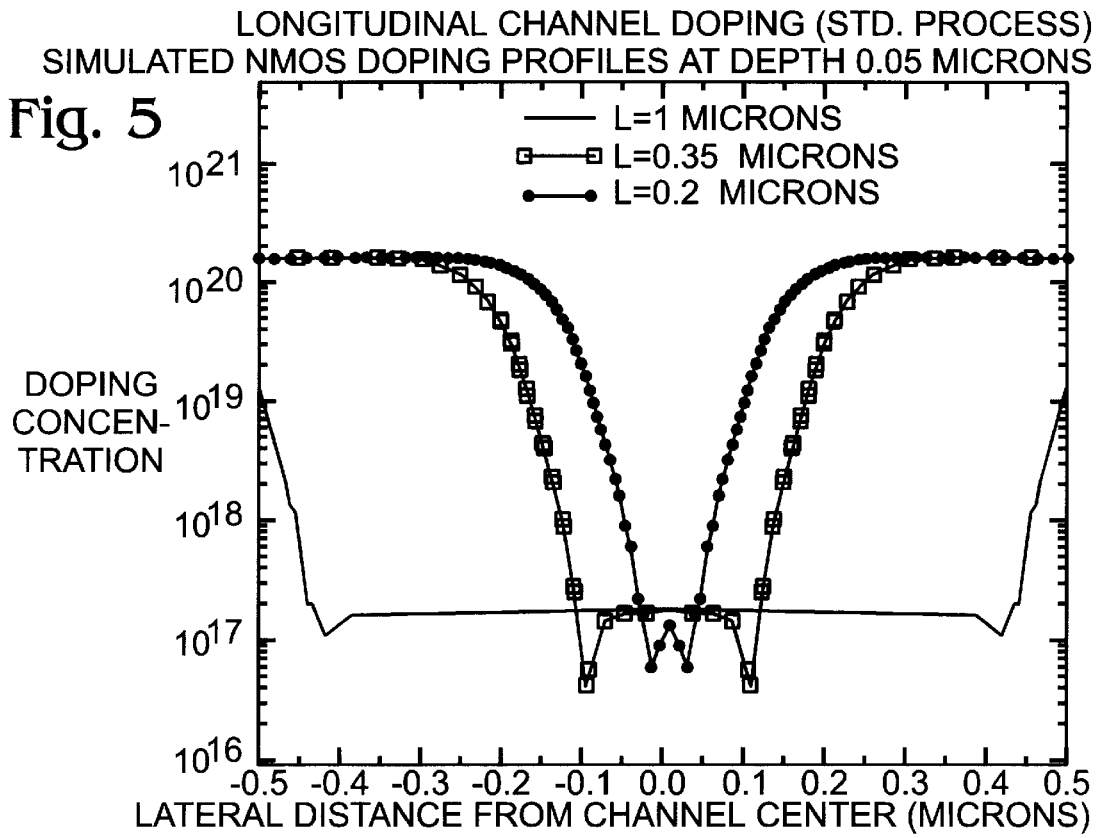
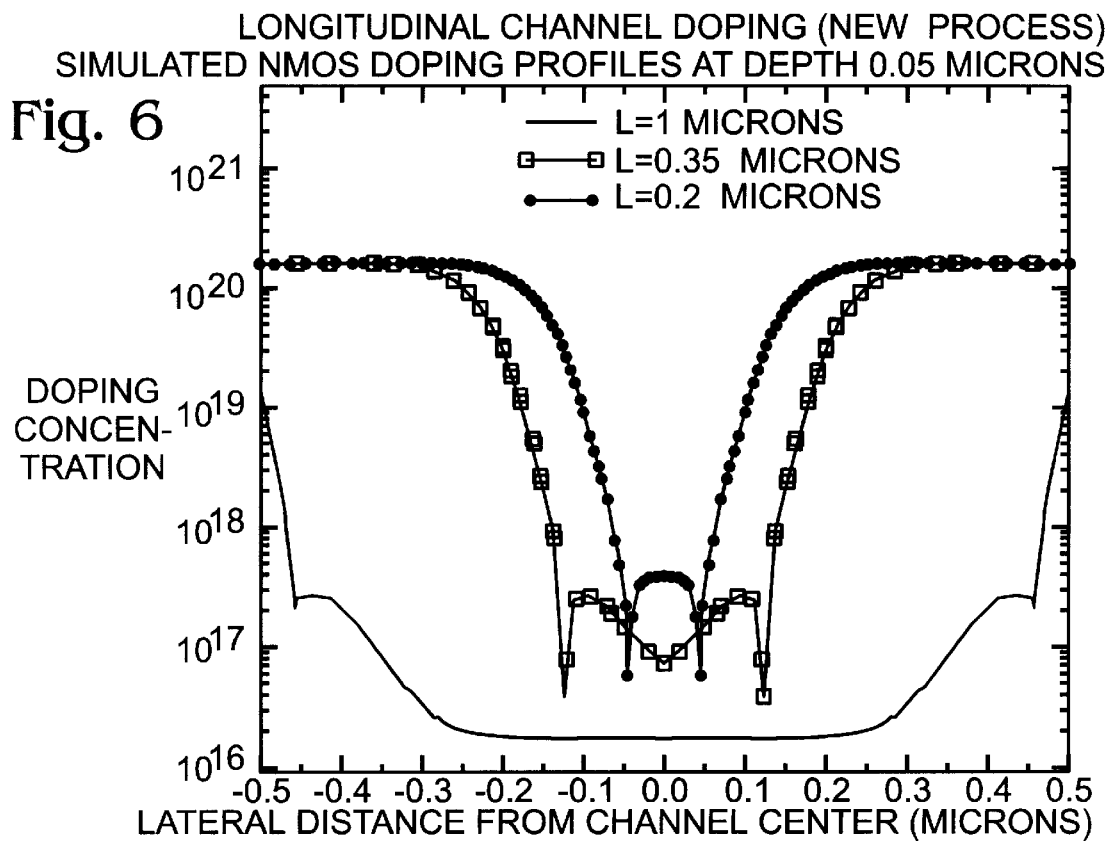

METHOD FOR ARTIFICIALLY-INDUCING REVERSE SHORT-CHANNEL EFFECTS IN DEEP SUB-MICRON CMOS DEVICES

BACKGROUND OF THE INVENTION

This invention relates generally to MOSFET devices and more particularly to a simplified process for doping CMOS devices to more easily and efficiently regulate their threshold voltage characteristics.

Designing MOS devices that possess adequate threshold voltage behavior at both long and short channel lengths is a difficult process because many of the process components that affect threshold voltage interact at short channel lengths. A conventional process flow involves two steps. A first VT-shift implantation step is performed to fix the threshold voltage ($V_T$) at long channel lengths. Secondly, a punchthrough implantation step is performed which prevents punchthrough and mitigates roll-off at short channel-lengths. "Roll off" is a term used to describe the reduction of threshold voltage with decreasing gate length due to the interaction of the source and drain regions of a MOSFET. An example of this effect is shown by line 86 in FIG. 7. Typically, this last step is accomplished using a high-angled implant of four discrete rotations performed after the gate of the CMOS device is etched.

This process is further complicated in CMOS technology where surface NMOS and PMOS transistors exist on the same wafer. Both devices are desired to have a particular threshold voltage where the characteristic behavior of the threshold voltage is predictably even over a range of channel lengths. Because the charge carrying mechanism is different in the two devices, it is impossible to induce a suitable threshold voltage for each device using a single mask and implant step. For instance, for a N-channel device, an implant of p-type dopant is required whereas for P-channel devices, an implant of n-type dopant is required.

Each of these VT-shift and masking steps increases the manufacturing costs for CMOS-based integrated circuits.

In addition to differences between N- and PMOS devices, there are also different problems associated with long and short channel devices.

Accordingly, the process steps used in conventional systems to stabilize the threshold voltage has traditionally been different. For instance, short channel devices suffer from "roll-off" where the threshold voltage drops sharply with decreasing channel lengths where channel-length can never be precisely controlled from device to device. Thus, in a 0.35 micron process, the MOSFET devices on any given wafer might have channel lengths which can vary from between 0.32 to 0.38 microns. If there is a precipitous roll-off in the threshold voltage, the threshold voltages can vary from between 0.3 to 0.5 volts. To reduce this so-called "short channel effect", punchthrough implants can be disposed adjacent the channel region of MOSFET devices according to a variety of well-known methods, thereby preventing a punchthrough of current at less than the desired threshold voltage for the device. At longer channel lengths, CMOS devices generally exhibit a drop off in their threshold voltage if punchthrough implants are used without corresponding VT-shift implants.

Accordingly, a need remains for a simplified universal process for setting the threshold voltage of various sizes and types of CMOS devices.

SUMMARY OF THE INVENTION

It is, therefore, an object of the invention to enable the setting of a stable threshold voltage for MOS devices of various channel lengths.

Another object of the invention is to reduce the number of process steps necessary to control the threshold voltages of both long channel and short channel devices.

Recently run simulations show that at short-channel lengths, the punchthrough implant is one of the predominant contributions to the device threshold voltage. This implies that the VT-shift implants are redundant at short channel lengths. Furthermore, at long channel lengths, the threshold voltage can be fixed using a four discrete rotation high-angled implant similar to the standard punchthrough implant. It is therefore possible to use a 4-way high-angled implant to fix both the long and short channel threshold voltages.

Using high-angled implants also induces an artificial reverse short-channel effect (RSCE) which can be exploited to mitigate against the normal threshold voltage drop-off. RSCE is defined as an increase in threshold voltage with decreasing channel length. This is the opposite of the regular short-channel effect where the threshold voltage decreases with decreasing channel length. Thus, high-angled implants may be used to achieve a flatter threshold voltage roll-off behavior.

The present invention comprises a method for controlling a threshold voltage through a semiconductor substrate of a first conductivity type (the type being an n- or p- type MOSFET) without the need for a blanket implant for either long or short channel devices. A gate structure having opposed lateral edges is formed adjacent a surface of the semiconductor substrate and over a channel region of the substrate.

The substrate is rotated around a rotation axis normal to the surface of the substrate to a first rotation position. Ions of a first conductivity type are then implanted into the channel region, using the gate structure as a mask, at an oblique angle relative to the surface of the substrate. The substrate is then rotated to a second rotation position approximately 180 degrees from the first rotation position. Ions of the first conductivity type are then implanted into the channel region, using the gate structure as a mask, at the oblique angle relative to the surface of the substrate.

In a CMOS system having devices disposed in four orientations along a wafer, the n-MOSFET and p-MOSFET devices are separately masked. High angle implants of the proper type and concentration are implanted in each of the device types using a 4-way implant method to dope the channel regions of each of the devices.

For each device, the present inventive method for fabricating a semiconductor device comprising the steps of forming a transistor structure normal to a rotation axis having a gate electrode, source and drain regions of a second conductivity type and a gate oxide on a semiconductor substrate of a first conductivity type. In the device, the source and drain regions being laterally separated within said substrate by a channel region. The channel region is doped between the source and drain regions in at least a two-way process. First, ions of a first conductivity type are angularly implanted adjacent a first edge of the gate electrode to dope the channel region beneath the gate electrode and between the source and drain regions. Dopant ions are also angularly implanted adjacent a second edge of the gate electrode to dope the channel region beneath the gate electrode and between the source and drain regions so that the threshold voltage of the channel is substantially controlled by the two angle implanting steps.

The method yields a semiconductor device wherein the channel region of the first conductivity type is disposed beneath the gate electrode and adjacent the source region and drain region. The channel has a unique non-uniform doping density profile along a length of the channel which is distinct from those devices using conventional threshold voltage shift blanket implants. The angularly implanted channel region is characterized by edge regions having a particular concentration, edge peak regions adjacent respective edge regions having a higher dopant concentration than the edge regions and a central trough region between the edge peak regions of a dopant concentration dependant upon the length of the channel. Simulations have shown that in long channel devices (where the channel region is greater than about 0.5 microns in length), the central trough region has a lower dopant concentration than the edge peak region. In short channel devices (where the channel region is less than about 0.5 microns), the central trough region has a dopant concentration due to lateral coalescing of dopant from the edge peak regions.

The present invention has several advantages over the prior art. Though a punchthrough masking and implantation step are not used, the advantages of using punchthrough implants for short-channel devices is maintained. Thus, threshold voltage roll-off is mitigated at short channel lengths. Furthermore, current leakage is minimized and sub-surface punchthroughs are prevented. Additional advantages imparted by use of the present invention for long-channel devices is the enablement of equivalent control over threshold voltage stability as compared to conventional methods; the need for VT-shift mask and implant steps is obviated; and the body effect of long-channel devices is minimized.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 4A–4C are sections respectively showing states of the semiconductor substrate at steps of successive masking and 4-way angular implantation of impurities into each MOSFET in a manufacturing method of a CMOS device according to the invention.

FIG. 5 is a graph showing the channel doping concentrations of three differently sized NMOS devices using conventional implantation methods.

FIG. 6 is a graph showing the channel doping concentrations of the NMOS devices of FIG. 5 using the implantation process prescribed by the present invention.

DETAILED DESCRIPTION

The disclosure applies equally well to both N and P surface-channel devices but for brevity we present the case of NMOS devices only. The process is analogous for PMOS.

Figure 1:
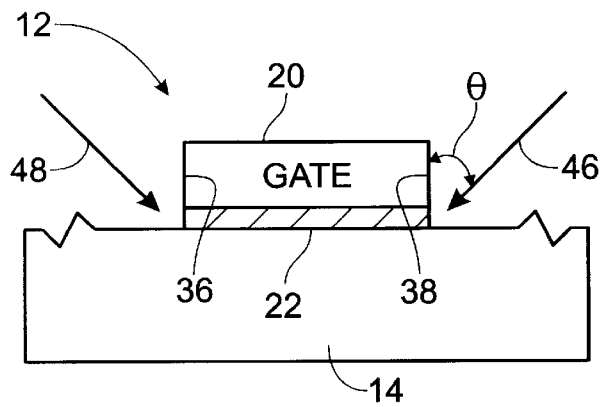
FIG. 1 is a cross-sectional representation a MOSFET device constructed according to the present invention.
Figure 2:
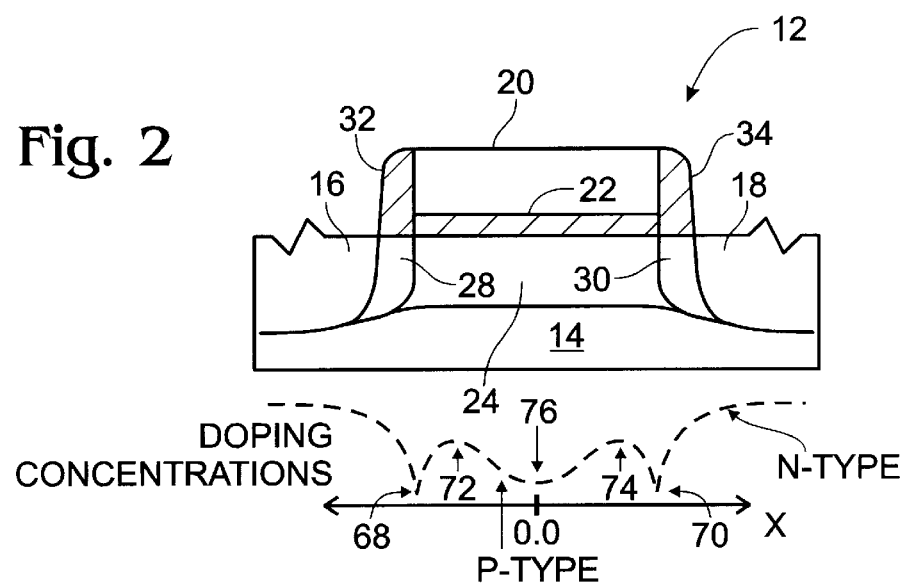
FIG. 2 is a cross-sectional representation of the MOSFET device of FIG. 1 shown with the channel doping concentration.

A cross-sectional structure for an in-process and a finished NMOS device is depicted schematically in FIGS. 1 and 2 respectively at 12. Device, 12 comprises a substrate 14 of a first conductivity type. The NMOS device 12 includes a substrate which is p-doped, meaning that the primary carriers of the substrate are "positive" holes. In PMOS devices, the first conductivity type is "negative" due to the n-doped substrate having electrons as the primary carriers. Device 12 further comprises a source region 16 and a drain region 18 of a second conductivity type formed in substrate 14. The second conductivity type is understood in the art to be opposite that of the first conductivity type. In the NMOS device 12 of FIG. 2, source and drain regions 16,18 are N+ doped to contain electrons as the primary carriers. In PMOS devices, source and drain regions 16,18 are P+ doped to contain holes as the primary carriers.

The MOSFET devices shown in FIGS. 1 and 2 include a gate electrode 20 and an insulator 22 such as an oxide which separates the gate electrode from the substrate. The region within the substrate and under the gate electrode 20 between the source and drain regions 16,18 is known generally as the "channel region" at 24 which separates the source and drain regions by a channel length and is doped by the inventive method discussed in further detail below. As shown in FIG. 2, the channel region 24 of the first conductivity type (p-type in the NMOS) is disposed beneath the gate electrode and adjacent the source and drain regions 16,18, separated only by interposed lightly doped regions 28,30 having a doping concentration which is less than the doping concentration of the source and drain regions 16,18.

The preferred structure also includes lightly doped drain regions 28,30 of the second conductivity type adjacent respective source and drain regions 16,18. Regions 28,30 can be formed by conventional means, as by implantation prior to deposition of oxide gate spacers 32,34 formed on lateral sides or edges 36,38 of the gate electrode 20. The angular implantation steps described below are preferably performed prior to spacer 32,34 formation, however implantation can be acomplished using both the gate 20 and spacers as masks.

The implant process depends upon five process control variables to affect the overall effect of the implant on the threshold voltage. The first variable is the dopant type. Since NMOS devices work on the principal of electron carriers, p-type dopant (boron) is used to dope the channel region. PMOS devices, which use holes as the carriers, generally use an n-type dopant (arsenic or phosphorus). The second variable is the dose of the dopant used which is measured by atoms per square centimeter of dopant implanted over a surface of the wafer. The dose level is used to adjust the charge density within the different regions of the MOSFET. For instance, in modern devices, the source and drain regions generally have a carrier charge density of $10^{19}$ to $10^{20}$ $cm^{-3}$ while the channel region may only have a carrier charge density of $10^{17}$ $cm^{-3}$. A third variable is the energy of the implant used. At lower implantation energies, the doping penetration in the device is shallow while at higher energies it is deep and distributed over a broad depth range.

Figure 3:
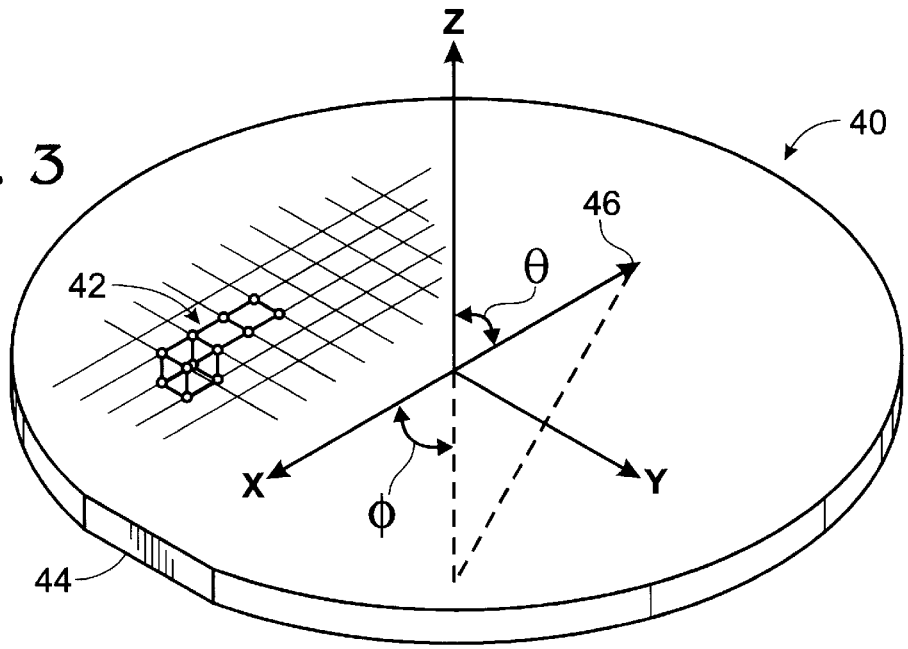
FIG. 3 is a perspective view of a semiconductor wafer showing rotational and tilt axes relative to the crystalline substrate of the wafer.

The fourth and fifth variables concern the implantation angle relative to the wafer surface. It is conventional in the art to cut thin wafers from a crystalline silicon ingot. FIG. 3 shows such an exemplary wafer at 40. The ingot is formed by a process well known in the art such that the silicon atoms are arranged in a cubic crystalline structure, shown generally at 42, which is normal to the length of the ingot shown by the z-axis. The wafer is cut such that its surface is a planar crystalline surface along the x-y axes and a notch or flattened portion 44 of the normally round wafer is indicative of a normal to the crystalline structure. The implantation tilt, shown as θ in FIGS. 1 and 3, is the angle relative to the surface of the wafer at which the dopant is introduced. The implantation tilt has been used in the art to fabricate halo-type punchthrough implant structures beneath the gate. The implantation rotation φ is the angle relative to the notch or flattened portion of the wafer (from the x-axis) at which the dopant is introduced.

The new process involves total omission of blanket VT-shift implants and masking steps and inclusion of a 4-way high-angled implant either after gate etch or spacer etch. For NMOS simulations discussed below, the high-angled implant comprised of boron at a tilt of 50 degrees (4discrete rotations) at an energy of 50 keV and a dose of $7 \times 10^{12}$ atoms/cm$^2$ implanted after spacer etch.

The present inventive method for controlling a threshold voltage through a semiconductor substrate of a first conductivity type comprises forming a gate structure 20 having opposed lateral edges 36,38 adjacent a surface of the semiconductor substrate 14 and over a channel region 24 of the substrate. Assuming that the wafer is aligned with the x-axis as shown in FIG. 3, the wafer substrate is rotated by an angle φ around a rotation (z-)axis normal to the surface of the substrate to a first rotation position. The preferred angle φ is between 10° and 30° in order that the implanted ions impact the crystalline structure of the substrate at an angle and the penetration of the implants be better controlled. Ions of a first conductivity type are implanted at an oblique angle θ relative to the surface of the substrate using the gate structure 20 as a mask, as shown best by arrow 46 in FIG. 1. Angle θ is preferably between 50° and 70° and depends upon the dopant concentration, the channel length and the desired threshold voltage. The wafer substrate is then rotated to a second rotation position approximately 180 degrees from the first rotation position (φ+180°) and dopant ions are again implanted into the channel region 24 at an oblique angle θ relative to the surface of the substrate, as shown best by arrow 48 in FIG. 1.

When wafer 40 includes MOSFET devices disposed at right angles to one another, then a 4-way angled implant is preferred. In the 4-way implant, the wafer substrate is rotated around the z- rotation axis to a third rotation position approximately 90 degrees from the first rotation position (φ+90°) where ions are then implanted. Finally, the wafer substrate is rotated around the z- rotation axis to a fourth rotation position approximately 270 degrees from the first rotation position (φ+270°) to thereby achieve a 4-way angle implantation into the channel region to form a desired doping concentration within and cross section depending upon a lateral distance within the channel region 24 from the gate edges 36,38.

FIG. 4A, 4B and 4C show the method of the present invention as applied to a CMOS device having both n- and p-MOSFETs. First, the semiconductor substrate of FIG. 4A is obtained by forming a well 50 of a second conductivity type in the semiconductor substrate 14 of the first conductivity type. For the sake of example, substrate 14 is a p-type semiconductor substrate and well 50 is an n-well on which are formed NMOS and PMOS devices 12,52 respectively. An isolation 54 is formed to isolate the substrate surface of the two devices.

A second gate structure 56 having opposed lateral edges 58,60 is formed adjacent a surface of the well 50 and over a channel region of the well. Gate structures 20,56 can be formed by conventional means such as by patterning a polysilicon layer. As the desired channel regions for the devices are surface channels, the polysilicon doping is complimentary such that NMOS gate 20 is doped with an n-type impurity and PMOS gate 56 is doped with a p-type impurity.

Referring now to FIG. 4B, the PMOS device 52 is masked off from a following implant step using mask 62. Ions of a first (p-) conductivity type are then angularly implanted in the direction shown by arrows 64 into a channel region beneath the gate 20 to form a p-type channel doping. An example of such an implant is a low-dose boron (B) ion implant which penetrates the substrate to form the doping profile shown by dashed-dotted line 66. This profile reflects a non-uniform doping concentration throughout the channel region 24 as shown in FIG. 2.

Referring back to FIG. 2 and FIG. 6, when angularly doped as above, the doping concentration of channel 24 is characterized by edge regions 68,70 having a particular concentration. Edge peak regions 72,74 having a high dopant concentration of opposite type are adjacent respective edge regions 68,70. Finally, a central channel region 76 is formed by the diffusion and coalescing of dopant within the substrate under gate 20. As shown best in the graph of FIG. 6, long channel devices exhibit a concentration trough in central region 76 having a lower dopant concentration between the edge peak regions 72,74. This trough becomes more pronounced as the channel lengths become longer, 1.0 microns versus 0.5 microns.

In the simulation results shown in FIG. 6, the edge region concentration varies from approximately $3 \times 10^{16}$ cm$^{-3}$ to $10^{17}$ cm$^{-3}$ according to the channel (gate masking) length. The edge peak regions have a concentration of approximately $2 \times 10^{17}$ cm$^{-3}$ and the central trough has a doping concentration which varies from $2 \times 10^{16}$ cm$^{-3}$ at long channels (1 micron) to $8 \times 10^{16}$ cm$^{-3}$ at shorter channel lengths (0.35 microns) to $3 \times 10^{17}$ cm$^{-3}$ at very short channel lengths (0.2 microns).

FIG. 4C shows a final step in the method for adjusting the threshold voltage level in CMOS devices according to the present invention. The NMOS device 52 is masked off from a following implant step using mask 78. Ions of a second (n-) conductivity type are then angularly implanted in the direction shown by arrows 80 into a channel region beneath the gate 56 to form an n-type channel doping. An example of such an implant is a low-dose phosphorous (P) or arsenic (As) ion implant which penetrates the substrate to form the doping profile shown by dashed-dotted line 82. This profile reflects a non-uniform doping concentration throughout a channel region beneath the gate 56 similar to the one shown in FIG. 2.

Long-Channel Threshold Voltage Behavior.

The long-channel threshold voltage is determined by the background well concentration and any additional dopant concentration arising in the channel due to the high-angled implant. FIG. 6 shows the simulated channel doping (in the longitudinal direction) for various NMOS channel lengths. The channel doping is increased in the region adjacent to the LDD regions due to the implant and this maintains reasonable threshold voltages at long channel lengths. FIG. 5 shows a comparable plot of the channel doping in a conventional CMOS process which uses VT-shift implants. The main difference in the new technology is that only the edges of the channel adjacent to the LDD regions receive doping which contributes to the threshold voltage. Thus, primary threshold voltage control is due to edge doping using the large angle-tilt implants (LAT).

Short-Channel Threshold Voltage Behavior.

Figure 7:
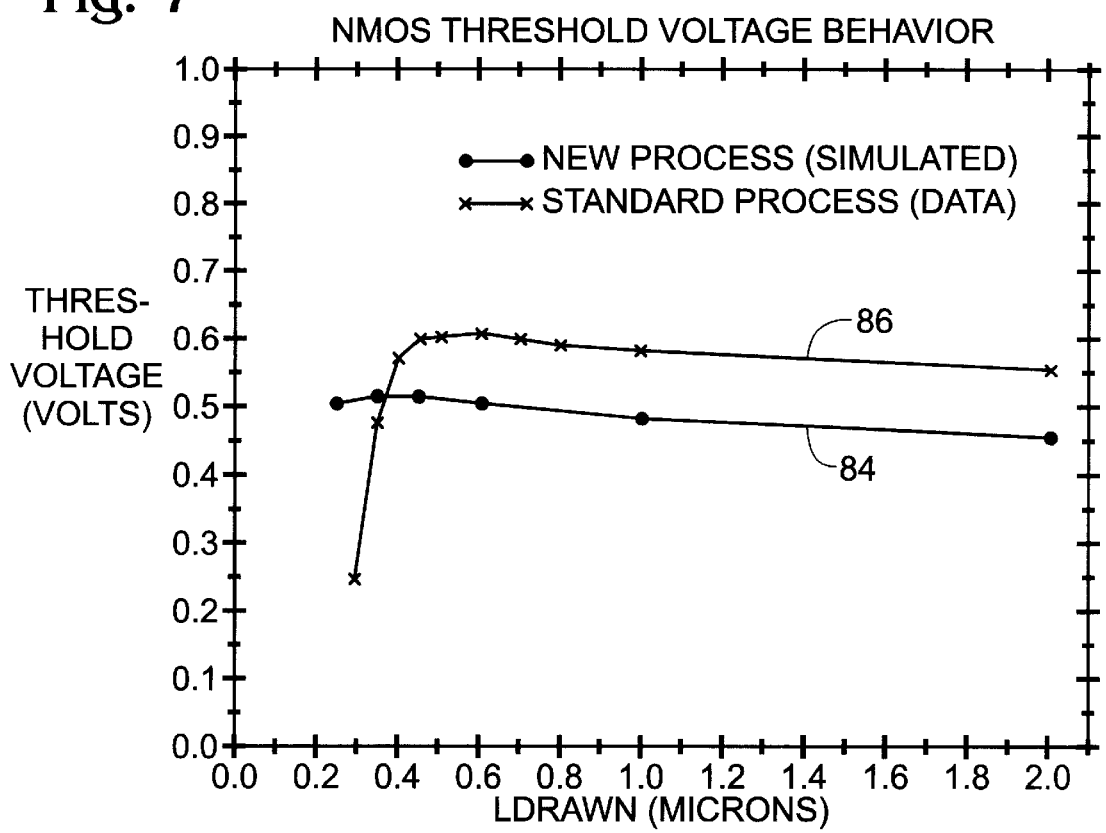
FIG. 7 is a graph showing the NMOS threshold voltage roll-off behavior of MOSFET devices constructed according to the present invention as compared to those constructed using conventional processes.

As the channel length decreases, the high-angled implant regions coalesce and cause the channel doping to increase (see FIG. 6). This causes an artificial reverse short-channel effect and suitable tuning of the high-angled implant conditions mitigates the opposing short-channel effects. In this fashion, the threshold voltage can be controlled to deep submicron channel lengths, as shown by line 84 in FIG. 7. FIG. 7 also shows the threshold voltage behavior of the standard process at 86. In this case, the channel doping remains constant irrespective of channel length and there is no artificial reverse short channel effect which may be used to mitigate against short channel effects. Roll-off begins to become dominate at about 0.5 microns where the threshold voltage drops precipitously from about 0.6 volts to only 0.25 volts at 0.3 microns.

Device Performance.

Figure 8A:
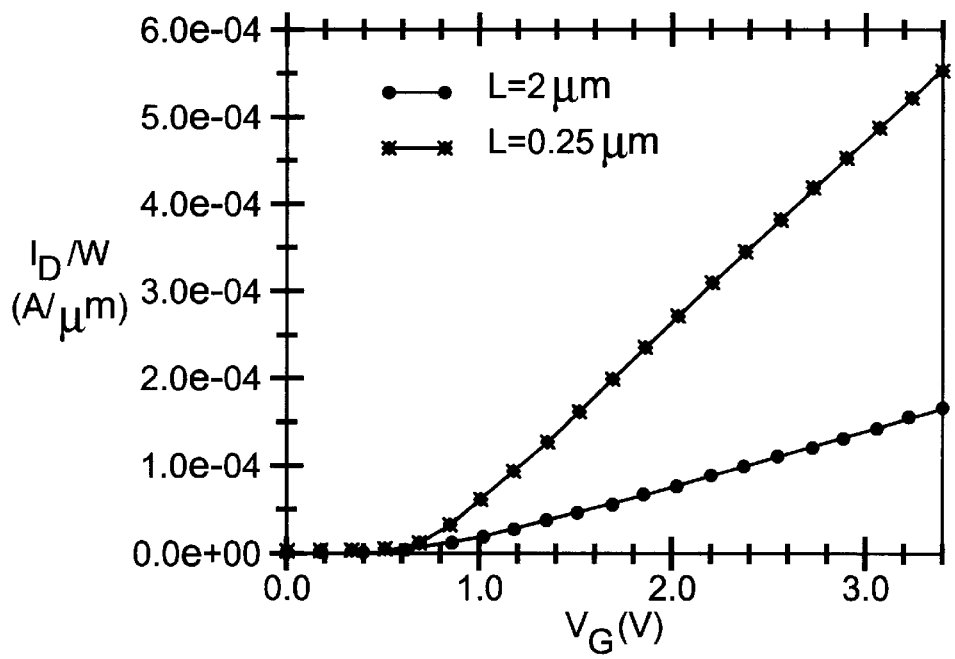
FIGS. 8A and 8B are graphs showing the current (I) versus voltage (V) characteristics of the NMOS shown generally in FIG. 2.
Figure 8B:
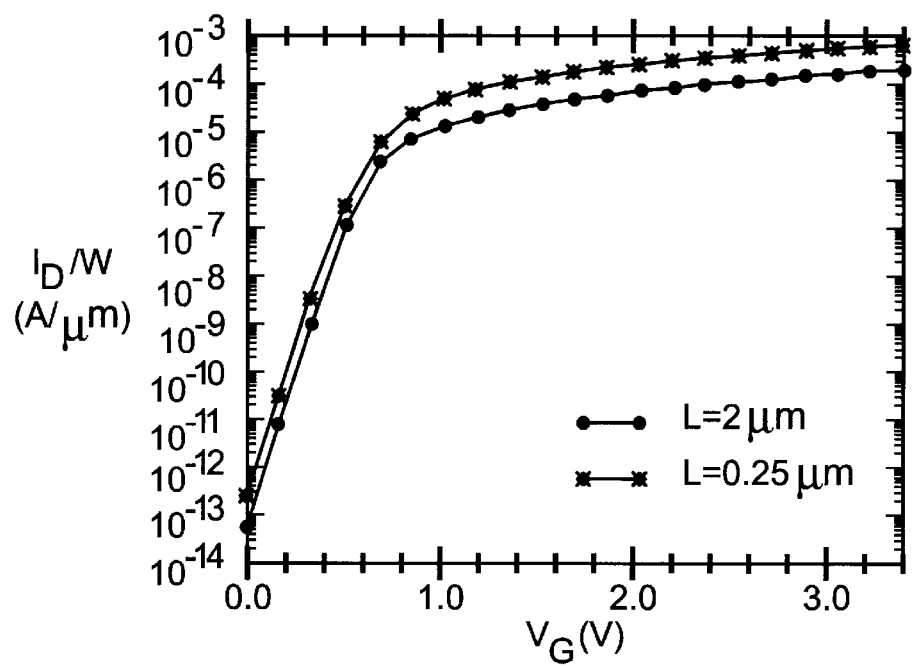

MOSFETs manufactured by this new process have very desirable electrical behavior but an unconventional channel doping. However, FIGS. 8A and 8B show that the simulated MOSFET drain current ($I_D$) versus applied gate voltage ($V_G$) characteristics for both the 0.25 and 2.0 micron devices are normal and without leakage problems.

A CMOS device constructed using a process described by the present invention incorporates all of the advantages of punchthrough implantation used for short-channel devices. Punchthrough implantation mitigates against $V_T$ roll-off at short-channel lengths (see FIG. 7). Additionally, current leakage, where a non-zero current through the device at zero gate bias and a large drain bias, is mitigated so that the transistor is completely off when the gate voltage is zero (FIG. 8B). Finally, sub-surface punchrough, where the drain and source get so close together that their depletion regions interact causing a current to punch through between the source and drain below the surface, is prevented at short-channel lengths.

The present invention also provides advantages when used with long-channel devices. First, the threshold voltages for long channel devices can be stabilized at an acceptable value. Second, the need for separate VT-shift masking and implant steps is obviated. Finally, the body effect or sensitivity of the threshold voltage to the source-substrate bias at long channel lengths is lowered.

Process Signature.

Figure 9:
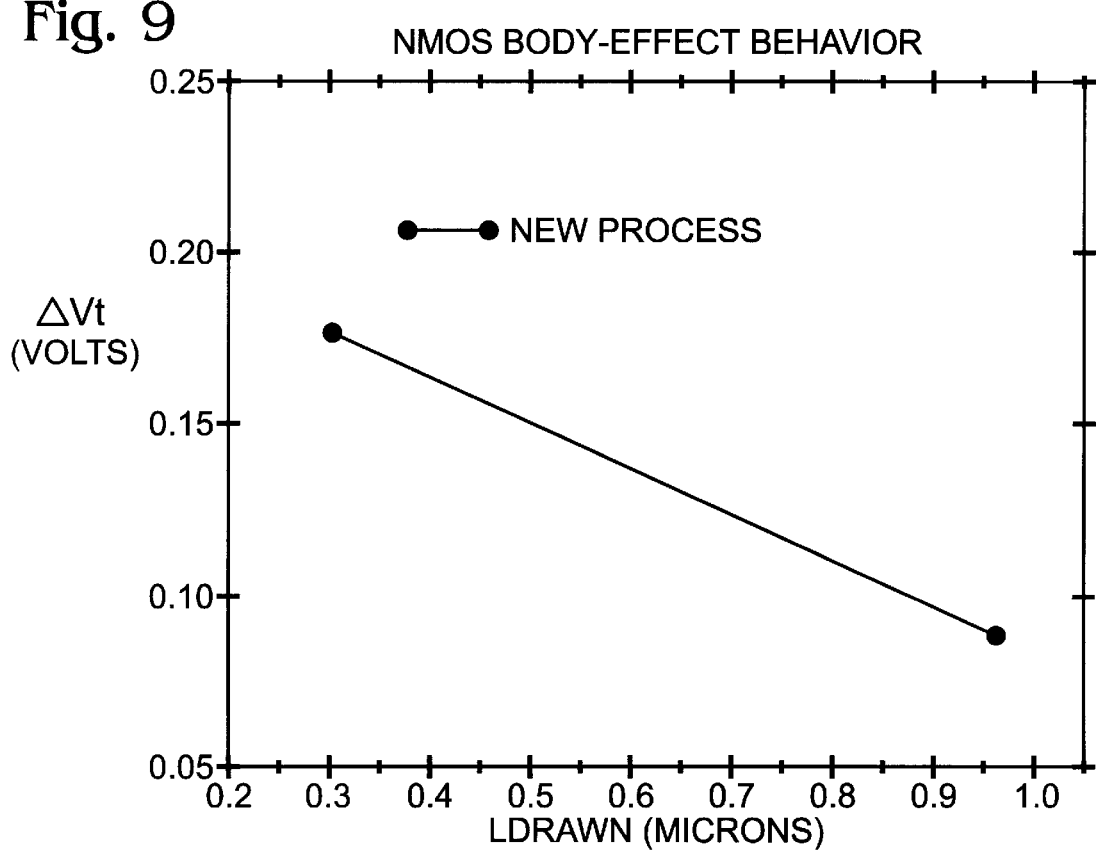
FIG. 9 is a graph showing the variability of the body effect behavior of MOSFETs constructed according to the present invention.

The new process employs a channel doping concentration which is gate length dependent. For this reason, the behavior of the transistor's threshold voltage to source-substrate bias (the "body effect") is distinctly different from conventional devices. FIG. 9 illustrates the body effect behavior for the new process. The body effect quickly decreases with channel length due to the lower channel doping in large channel-length devices (see FIG. 6). A conventional process would not exhibit a body effect that decreases with channel-length because the channel doping is relatively constant across different device sizes due to the conventional blanket VT-shift implant. This behavior, coupled with the relatively flat threshold voltage behavior across devices ranging from 0.2 microns to 2.0 microns, could be used as a means of detecting the use of this invention.

Advantages over Conventional Systems

Using an optimized 4-way high angled implant to manufacture CMOS devices provides many advantages. First, it fixes the threshold voltages for both short-channel and long-channel devices. Second, the process yields CMOS devices having very flat roll-off characteristics. Third, the process yields punchthrough protection. Fourth, the 4-way high angled implant process eliminates all threshold shift masking and blanket implant steps from the process.

Since the cost of a process is directly proportional to the number of masking steps, this new process would save two implant and masking steps if done within the context of a dual-poly process containing independent VT-shift implants for NMOS and PMOS devices. A simplified process also allows for more efficient DOEs (Design of Experiments) to be performed during the process integration phase of a new technology.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. A method for fabricating a semiconductor device comprising the steps of:

forming a transistor structure normal to a rotation axis having a gate electrode, source and drain regions of a second conductivity type and a gate oxide on a semiconductor substrate of a first conductivity type, said source and drain regions being laterally separated within said substrate by a channel region;

doping the channel region between the source and drain regions, said doping step including:

angularly implanting ions of a first conductivity type adjacent a first edge of the gate electrode to dope the channel region beneath the gate electrode and between the source and drain regions; and angularly implanting ions of a first conductivity type adjacent a second edge of the gate electrode to dope the channel region beneath the gate electrode and between the source and drain regions so that the threshold voltage of the channel is substantially controlled by the two angle implanting steps.

2. The method according to claim 1, further including forming a spacer on each lateral edge of the gate electrode prior to the angular implantation steps.

3. A method for manufacturing a CMOS transistor with a n-MOSFET and a p-MOSFET on a semiconductor substrate, comprising the steps of:

forming a gate electrode of the n-MOSFET and a gate electrode of the p-MOSFET on the semiconductor substrate;

angularly implanting an ion implant of a p-type impurity to only the n-MOSFET, using the n-MOSFET gate electrode as a mask, to form a p-type surface channel region beneath the gate electrode of the n-MOSFET; and angularly implanting an ion implant of an n-type impurity to only the p-MOSFET, using the p-MOSFET gate electrode as a mask, to form an n-type surface channel region beneath the gate electrode of the p-MOSFET.

4. The method according to claim 3 wherein the angular implantation steps are conducted according to a 4-way large angle ion implant method.

5. The method according to claim 3 wherein the gate electrodes are formed of polysilicon and the step of forming the gate electrode of the n-MOSFET includes doping the polysilicon with a n-type impurity and the step of forming the gate electrode of the p-MOSFET includes doping the polysilicon with a p-type impurity.

6. A method for controlling a threshold voltage through a semiconductor substrate of a first conductivity type, comprising:

forming a gate structure having opposed lateral edges adjacent a surface of the semiconductor substrate and over a channel region of the substrate;

rotating the substrate around a rotation axis to a first rotation position, said rotation axis being normal to the surface of the substrate;

implanting ions of a first conductivity type into the channel region, using the gate structure as a mask, at an oblique angle relative to the surface normal of the substrate;

rotating the substrate to a second rotation position approximately 180 degrees from said first rotation position; and implanting ions of the first conductivity type into the channel region, using the gate structure as a mask, at the oblique angle relative to the surface of the substrate.

7. The method according to claim 6, further including rotating the substrate around said rotation axis to a third rotation position approximately 90 degrees from said first rotation position; and rotating the substrate around said rotation axis to a fourth rotation position approximately 270 degrees from said first rotation position to thereby achieve a 4-way angle implantation into the channel region to form a desired doping concentration within and cross section depending upon a lateral distance within the channel region from the gate edges.

8. The method according to claim 6, wherein the oblique angle is from between approximately 10° to 30°.

9. The method according to claim 8, wherein the first rotation position of between approximately 50° to 70° to a normal of the crystalline structure of the substrate.

10. The method according to claim 6, further including:

forming a well of a second conductivity type in the semiconductor substrate;

forming a second gate structure having opposed lateral edges adjacent a surface of the well and over a channel region of the well;

implanting ions of a second conductivity type into the channel region, using the gate structure as a mask, at a second oblique angle relative to the surface of the well at the first rotation position; and implanting ions of the second conductivity type into the channel region, using the gate structure as a mask, at the second oblique angle relative to the surface of the substrate at the second rotation position.

11. The method according to claim 6 wherein the channel region is less than about 0.5 microns, said channel having a non-uniform doping density profile along a length of the channel which is characterized by edge regions having a particular concentration, edge peak regions adjacent respective edge regions having a higher dopant concentration and a central channel region of a dopant concentration caused by lateral coalescing of dopant from said edge peak regions.

12. The method according to claim 6 wherein the channel region is equal to or greater than about 0.5 microns, said channel having a non-uniform doping density profile along a length of the channel which is characterized by edge regions having a particular concentration, edge peak regions adjacent respective edge regions having a higher dopant concentration than the edge regions and a central trough region of lower dopant concentration between the edge peak regions.

13. The method according to claim 12 wherein the channel region is at least approximately 1.0 microns in length.

* * * * *